(12) United States Patent
Tan et al.

(10) Patent No.: US 9,368,386 B2
(45) Date of Patent: Jun. 14, 2016

(54) CORNER TRANSISTOR SUPPRESSION

(71) Applicant: GLOBALFOUNDRIES Singapore Pte. Ltd., Singapore (SG)

(72) Inventors: Shyue Seng Tan, Singapore (SG); Ying Keung Leung, Singapore (SG); Elgin Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 103 days.

(21) Appl. No.: 13/927,588

(22) Filed: Jun. 26, 2013

(65) Prior Publication Data

US 2013/0288452 A1 Oct. 31, 2013

Related U.S. Application Data

(62) Division of application No. 13/112,317, filed on May 20, 2011, now abandoned.

(51) Int. Cl.
*H01L 21/70* (2006.01)
*H01L 21/336* (2006.01)
*H01L 21/76* (2006.01)
*H01L 21/762* (2006.01)
*H01L 21/8234* (2006.01)

(52) U.S. Cl.
CPC .... *H01L 21/76224* (2013.01); *H01L 21/76232* (2013.01); *H01L 21/823481* (2013.01)

(58) Field of Classification Search
CPC ............... H01L 21/76224; H01L 21/76232; H01L 21/76229; H01L 21/823481; H01L 21/823478
USPC ................ 257/499, 501, 510, 513, 506, 374, 257/E21.54, E29.02; 438/424, 435–437, 438/221, 296, 359
See application file for complete search history.

(56) References Cited

U.S. PATENT DOCUMENTS

| 6,373,119 | B1 | 4/2002 | Noda |
| 6,653,194 | B1 | 11/2003 | Park |
| 6,657,276 | B1 | 12/2003 | Karlsson et al. |
| 6,984,569 | B2 | 1/2006 | Karlsson et al. |
| 7,001,823 | B1 | 2/2006 | Gopinath et al. |
| 7,091,106 | B2 | 8/2006 | Bonser et al. |
| 2001/0028097 | A1* | 10/2001 | Matsuoka ......... H01L 21/76237 257/506 |
| 2002/0117731 | A1* | 8/2002 | Kim et al. ............... 257/510 |
| 2004/0173812 | A1* | 9/2004 | Currie et al. ............ 257/103 |
| 2005/0151218 | A1* | 7/2005 | Mouli .................... 257/446 |
| 2006/0046427 | A1* | 3/2006 | Ingle et al. ............. 438/424 |
| 2007/0007571 | A1 | 1/2007 | Lindsay et al. |
| 2007/0205489 | A1* | 9/2007 | Tilke et al. ............. 257/618 |
| 2008/0001249 | A1 | 1/2008 | Sheen et al. |
| 2009/0209083 | A1* | 8/2009 | Chen ................ H01L 21/76224 438/433 |
| 2011/0081765 | A1 | 4/2011 | Cummings et al. |
| 2012/0187523 | A1* | 7/2012 | Cummings et al. ......... 257/506 |

OTHER PUBLICATIONS

Hobbs, C. et al. "Fermi Level Pinning at the PolySi/Metal Oxide Interface" 2003 Symposium on VLSI Technology Digest of Technical Papers, 2 pages.

* cited by examiner

*Primary Examiner* — Fernando L Toledo
*Assistant Examiner* — Aaron Gray
(74) *Attorney, Agent, or Firm* — Ditthavong & Steiner, P.C.

(57) ABSTRACT

The threshold voltage of parasitic transistors formed at corners of shallow trench isolation regions is increased and mobility decreased by employing a high-K dielectric material. Embodiments include STI regions comprising a liner of a high-K dielectric material extending proximate trench corners. Embodiments also include STI regions having a recess formed in the trench, wherein the recess contains a high-K dielectric material, in the form of a layer or spacer, extending proximate trench corners.

5 Claims, 5 Drawing Sheets

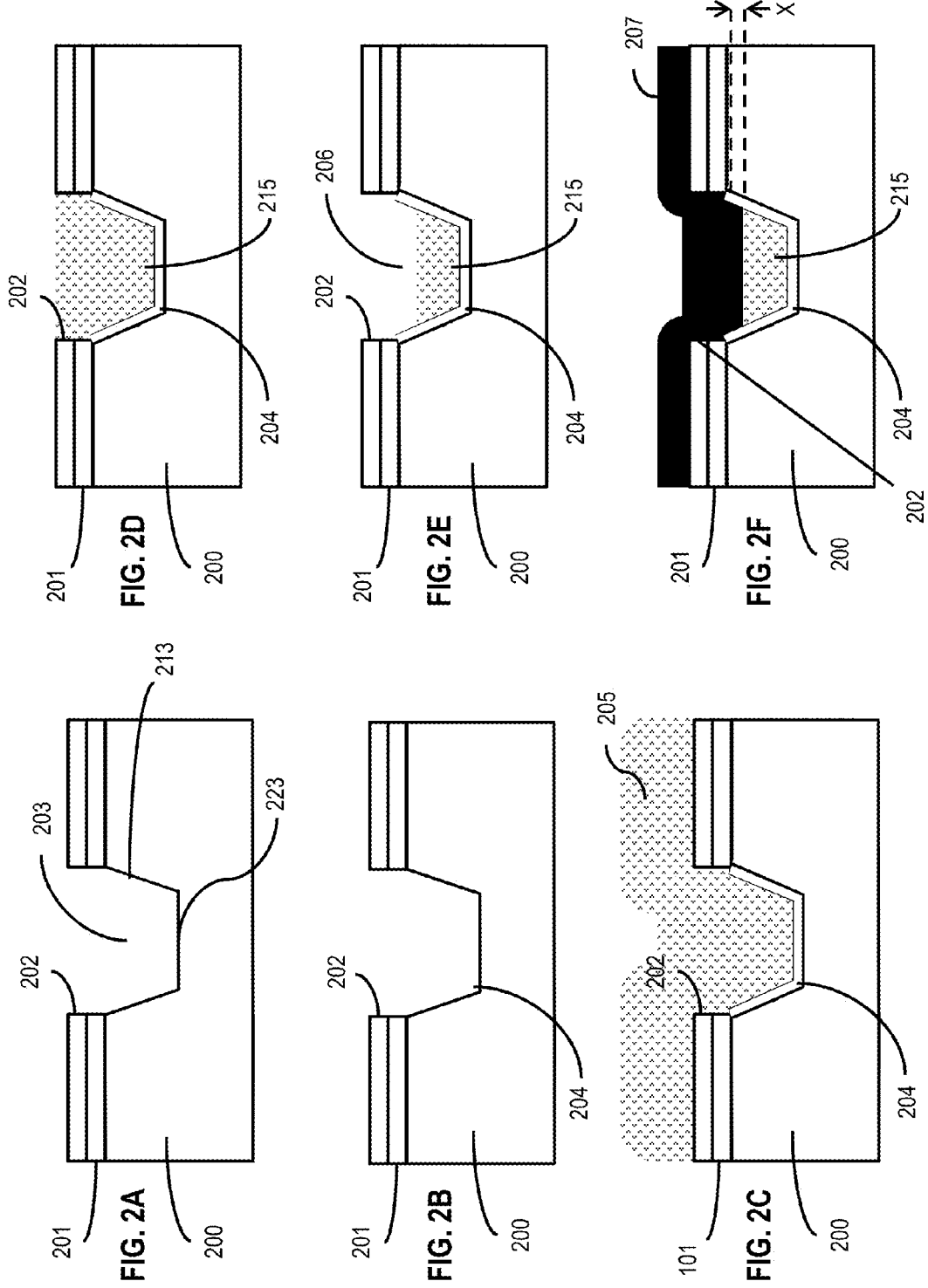

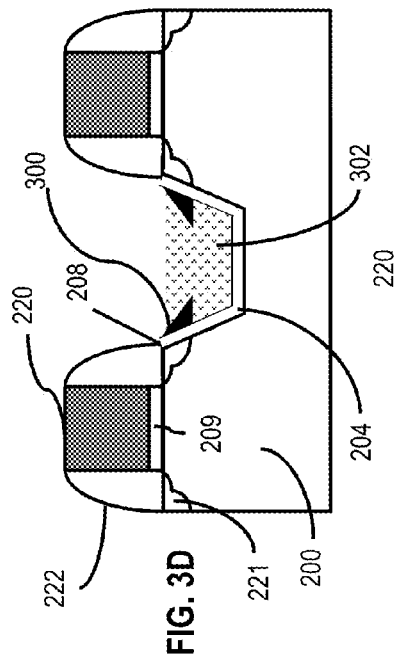
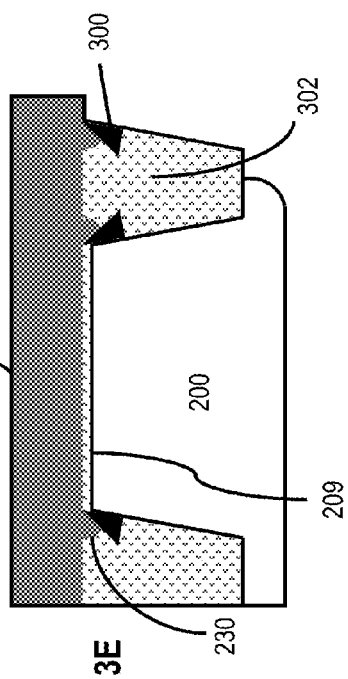
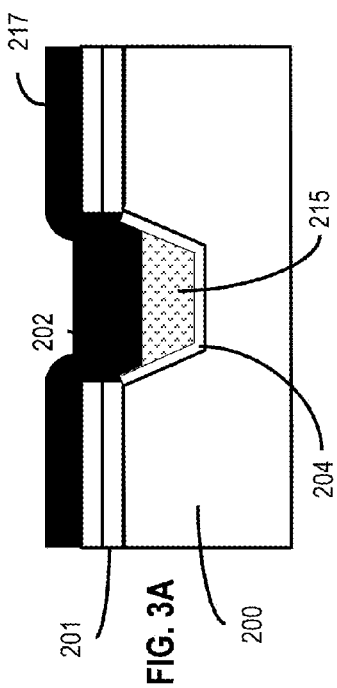
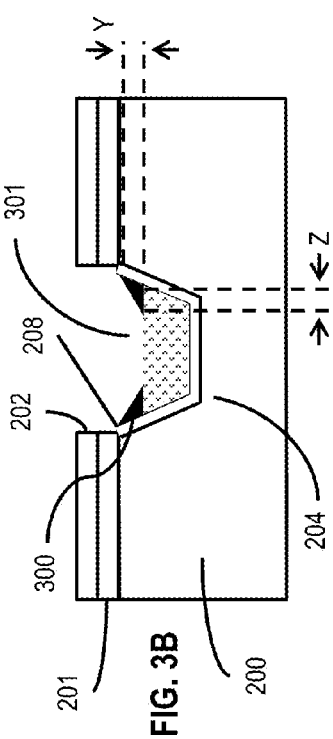
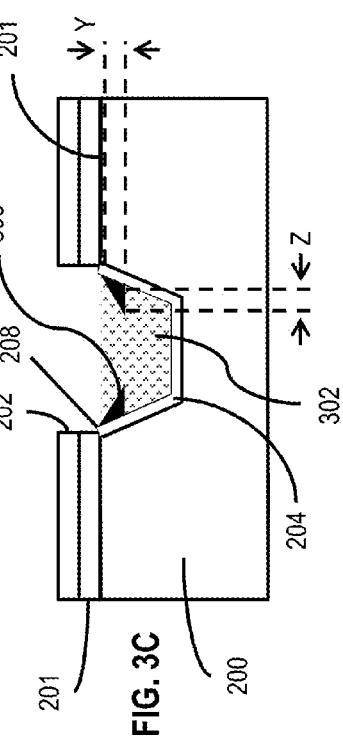

CORNER TRANSISTOR SUPPRESSION

CROSS REFERENCE TO RELATED APPLICATION

This Application is a divisional of U.S. application Ser. No. 13/112,317 filed May 20, 2011. The entirety of which is incorporated herein by reference.

TECHNICAL FIELD

The present disclosure relates to semiconductor devices containing trench isolation regions and exhibiting increased device performance, yield, and reliability. The present disclosure is particularly applicable to fabricating semiconductor devices with reduced parasitic leakage and improved transistor on current to transistor off current (Ion-Ioff) performance.

BACKGROUND

As technological advances plunge deeper into submicron geometries, shallow trench isolation (STI) is replacing local oxidation of silicon (LOCOS) processes for the formation of isolation structures. STI processes advantageously allow for planarization of the entire substrate and isolation structure, thereby providing better control of a critical dimension (CD), e.g., when defining the gate stack of a transistor.

Conventional STI processing includes forming a pad oxide layer on a substrate, forming a pad nitride layer over the pad oxide layer, and forming a trench through the pad oxide and nitride layers in the substrate, as by reactive ion etching (RIE). A liner oxide is then thermally grown to anneal out any damage to and to passivate the substrate. The trench is then filled with an insulating material, typically an oxide, followed by chemical-mechanical polishing (CMP) such that the upper surface of the filled trench is substantially coplanar with the upper surface of the pad nitride layer. The pad nitride and oxide layers are then stripped resulting in the STI structure. Subsequent conventional processing includes forming transistors spaced apart by the STI.

In implementing STI, sharp corners are typically formed where the trench sidewall intersects the top surface of the substrate, adversely impacting device performance, yield, and liability. Typically, a parasitic transistor having a relatively low threshold voltage is formed at the trench corner. Such parasitic transistors result in a high leakage issues and degrade Ion-Ioff performance, in addition to increasing linear threshold voltage (Vtlin) mismatch. Conventional approaches to the parasitic transistor issue involve rounding the transistor corner in attempting to reduce the electric field, and additional field implants to increase the threshold voltage of the parasitic transistor. Such approaches have not met with complete success, become increasingly more difficult as geometries plunge, and adversely impact STI efficacy.

A need therefore exists for methodology enabling the fabrication of semiconductor devices having STI structures with reduced leakage current, reduced degradation of Ion-Ioff performance, and reduced Vtlin mismatch. A particular need exists for methodology enabling the fabrication of semiconductor devices with CDs in the deep submicron range, wherein parasitic transistors formed at trench corners exhibit an increased threshold voltage and reduced mobility.

SUMMARY

An aspect of the present disclosure is a method of fabricating a semiconductor device having STI regions, wherein parasitic transistors formed at trench corners exhibit an increased threshold voltage and reduced mobility.

Another aspect of the present disclosure is a semiconductor device having STI regions wherein parasitic transistors formed at trench corners exhibit an increased threshold voltage and reduced mobility.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

Aspects of the present disclosure include forming a trench, having side surfaces and a bottom surface, in a substrate; forming an oxide liner on the side surfaces and bottom surface of the trench; and forming a layer of high-K dielectric material on the oxide liner. Additional aspects include sequentially forming a pad oxide layer on an upper surface of the substrate; forming a pad nitride layer on the pad oxide layer; forming the trench in the substrate; filling the trench with insulating material forming an overburden on the pad nitride layer; and planarizing such that an upper surface of the insulating material is substantially coplanar with an upper surface of the pad nitride layer, wherein the layer of high-K dielectric material extends proximate corners of the trench. Further aspects include removing the pad oxide and pad nitride layers from the upper surface of the substrate, leaving the filled trench as a STI region; and forming transistors on the substrate separated by the STI region, wherein, the layer of high-K dielectric material increases the threshold voltage of and lowers the mobility of a parasitic transistor formed at a trench corner.

Other aspects of the present disclosure include forming a trench, having corners, side surfaces, and a bottom surface, in a substrate having an upper surface; filling the trench with an insulating material; removing insulating material from the trench to form a recess therein extending below the upper surface of the substrate; and providing a high-K dielectric material in the recess. Additional aspects include forming an oxide liner on the side surfaces and bottom surface of the trench before filling the trench with insulating material. Further aspects include providing the high-K dielectric material in the form of a layer or a spacer proximate a trench corner. Aspects also include sequentially forming a pad oxide layer on the upper surface of the substrate; forming a pad nitride layer on the pad oxide layer; forming the trench in the substrate; forming an oxide liner in the trench filling the trench with insulating material forming an overburden on the pad nitride layer; planarizing such that an upper surface of the insulating material is substantially coplanar with an upper surface of the pad nitride layer; forming a layer of the high-K dielectric material over the pad nitride layer and filling the recess; and removing portions of the high-K dielectric material from over the pad nitride layer leaving the high-K dielectric material in the recess with an upper surface which is substantially coplanar with the upper surface of the substrate, wherein the high-K dielectric material in the recess extends proximate corners of the trench. A further aspect includes etching the layer of high-K dielectric material in the recess to form a high-K spacer proximate the trench corners and a sub-recess, then refilling the trench sub-recess with insulating material. Additional aspects include removing the pad nitride and pad oxide layers from the upper surface of the substrate, leaving the filled trench as a STI region; and forming transistors on the substrate separated by the STI region, wherein, the high-K dielectric material in the recess increases the threshold voltage of and lowers the mobility of a parasitic transistor formed at a trench corner.

Another aspect of the present disclosure includes a semiconductor device comprising a trench isolation region formed in a substrate, the trench isolation region comprising: a trench having corners, side surfaces, and a bottom surface; an oxide liner on the side surfaces and bottom surface of the trench; a layer of high-K dielectric material on the oxide liner extending proximate trench corners; and insulating material filling the trench. Aspects include a semiconductor device comprising transistors on the substrate separated by the trench isolation region, wherein the layer of high-K dielectric material increases the threshold voltage of and lowers the mobility of a parasitic transistor formed at a trench corner.

A further aspect of the present disclosure includes a semiconductor device comprising a trench isolation region formed in a substrate, the substrate having an upper surface, the trench isolation region comprising a trench having corners, side surfaces, and a bottom surface; insulating material filling the trench; a recess in the insulating material extending below the upper surface of the substrate; and a high-K dielectric material in the recess extending proximate trench corners, wherein the high-K dielectric material in the recess is in the form of a layer or spacer proximate trench corners and increases the threshold voltage of and lowers the mobility of a parasitic transistor formed at a trench corner.

Another further aspect of the present disclosure includes a semiconductor device comprising transistors formed in a substrate; and a trench isolation region formed between the transistors, the trench isolation region containing means for increasing the threshold voltage of and lowering the mobility of a parasitic transistor formed at a trench corner.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2I schematically illustrate sequential steps in accordance with another embodiment of the present disclosure.

FIGS. 3A through 3E schematically illustrate sequential steps in accordance with a further embodiment of the present disclosure.

DETAILED DESCRIPTION

Figure 1A:
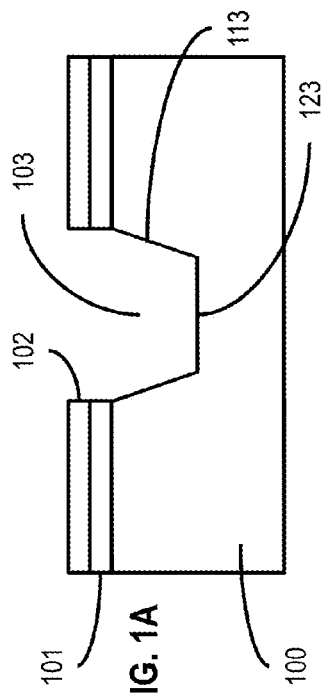
FIGS. 1A through 1H illustrate sequential steps in accordance with an embodiment of the present disclosure.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are not shown to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves, inter alia, problems attendant upon fabricating semiconductor devices with STI, particularly the adverse impact of parasitic transistors formed at the corners of the STI structures. Such trench corners are relatively sharp causing high leakage, degrading Ion-Ioff performance and increasing Vtlin mismatch. The present invention addresses and solves such problems by providing means to increase the threshold voltage of resulting parasitic transistors while reducing mobility.

In accordance with embodiments of the present disclosure, STI structures are formed with a high-K dielectric material proximate trench corners. The formation of such a high-K dielectric material proximate trench corners results in Fermi-level pinning as well as degrading mobility from the high-K/semiconductor interface.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A method in accordance with an embodiment of the present disclosure is schematically illustrated in FIGS. 1A through 1F. Adverting to FIG. 1A, a trench 103 is formed in substrate 100 by depositing a pad oxide layer 101, e.g., silicon dioxide, as at a thickness of 20 angstroms (Å) to 80 Å, e.g., 45 Å to 55 Å, forming pad nitride layer 102, e.g., $Si_3N_4$, as at a thickness of about 1000 Å to 2000 Å, e.g., 1450 Å to 1550 Å, on pad oxide layer 101. Substrate 100 may be any of various substrates conventionally employed in the fabrication of semiconductor devices, such as bulk silicon (as illustrated), silicon-on insulator (SOI), and substrates based on strained silicon or silicon-germanium. Etching is then conducted, such as RIE, to form trench 103 having side surfaces 113 and a bottom surface 123, as at a width of 500 Å to 1000 Å, e.g., 790 Å to 810 Å, and a depth of 1500 Å to 4000 Å, e.g., 2450 Å to 2550 Å.

Figure 1B:
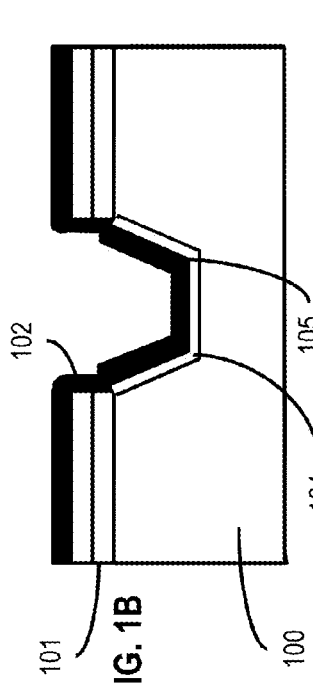

As illustrated in FIG. 1B, liner oxide 104 is then formed, as by thermal oxidation, as at a thickness of 10 Å to 40 Å, e.g., 19 Å to 21 Å, lining the side surfaces 113 and bottom surface 123 of trench 103. In accordance with embodiments of the present disclosure, a layer of high-K dielectric material 105 is then deposited over the pad nitride layer 102 and on the liner oxide 104, as at a thickness of 20 Å to 80 Å, e.g., 48 Å to 52 Å. As employed throughout the present disclosure, a high-K dielectric material is intended to include dielectric materials having a dielectric constant K equal to or greater than 4, relative to the dielectric constant K of 1 for a vacuum. Suitable dielectric materials may include aluminum oxide ($Al_2O_3$), zirconium silicate, hafnium silicate, hafnium silicate oxynitride, hafnium silicon nitride, hafnium oxide ($HfO_2$), zirconium oxide ($ZrO_2$), cerium oxide ($CeO_2$), titanium dioxide ($TiO_2$), tantalum oxide ($Ta_2O_5$), tungsten oxide ($WO_3$), and yttrium ($Y_2O_3$).

Figure 1C:
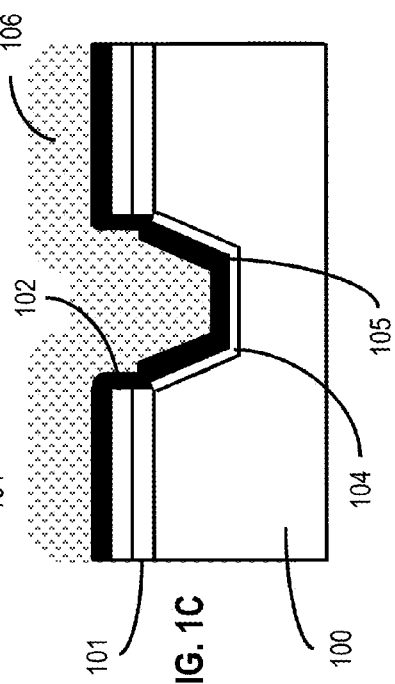
Figure 1D:
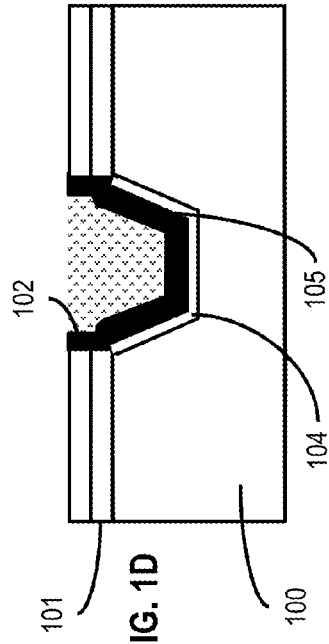
Figure 1E:
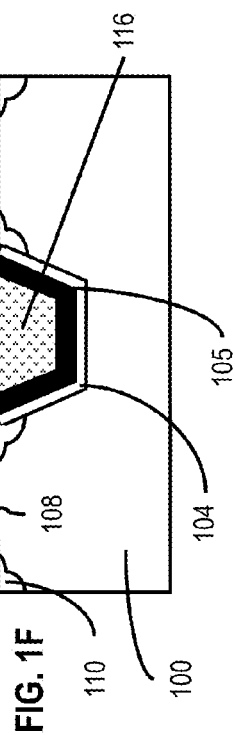

Adverting to FIG. 1C, an insulating material 106, such as silicon dioxide, is then deposited to fill the trench and form an overburden on pad nitride layer 102. In accordance with embodiments of the present invention, trench filling may be implemented by a high aspect ratio process capable of filling gaps with an aspect ratio of greater than 7:1 for 32 nm technology nodes and below, e.g., 28 nm technology nodes and below. A suitable gap filling technique is known as HARP™ and is available from Applied Materials, Santa Clara, Calif. Subsequently planarization is implemented in a conventional manner, as by CMP, such that the upper surface of the insulating material filling the trench is substantially coplanar with the upper surface of the pad nitride layer 102, as illustrated in FIG. 1D. Pad nitride layer 102, pad oxide layer 101, and the portions of high-K dielectric layer and trench fill extending above the substrate are then removed, as by etching, resulting in the structure illustrated in FIG. 1E, wherein the trench is filled with insulating material 116.

Figure 1F:
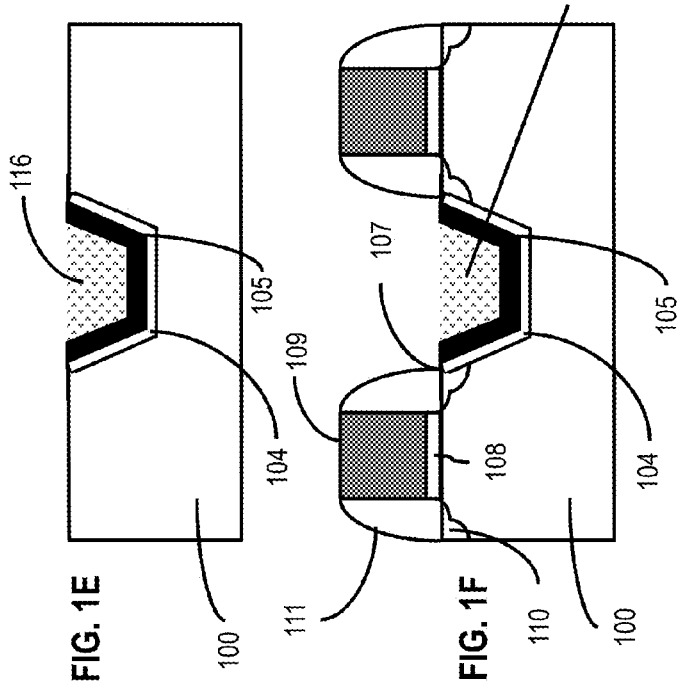
Figure 1G:
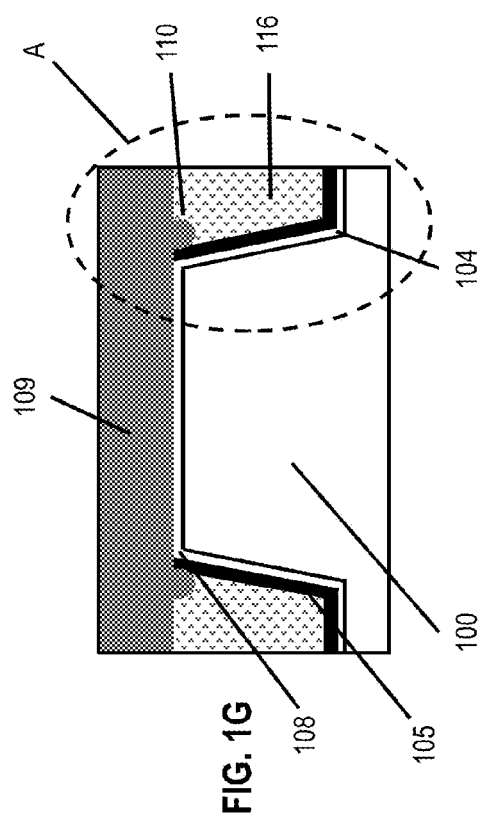
Figure 1H:
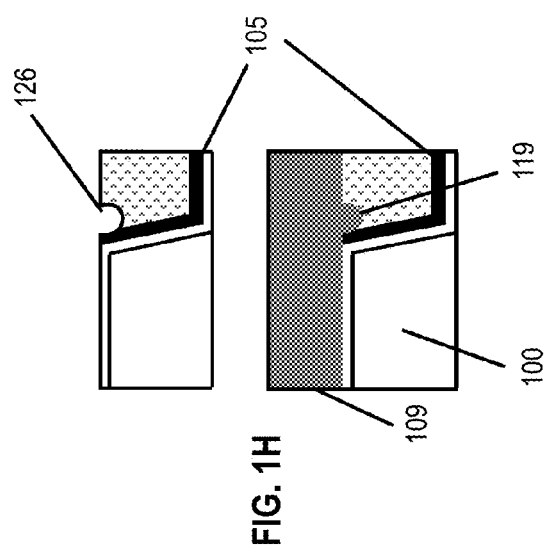

Subsequent processing is conducted in accordance with conventional practices and involves forming transistors on opposite sides of the STI. Each transistor may typically comprise a gate dielectric layer 108, gate electrode 109, source/drain regions 110, and sidewall spacers 111. FIG. 1F illustrates the resulting structure in the channel length direction, while FIG. 1G illustrates the resulting structure in the channel width direction, FIG. 1H illustrates a portion of area A with divot 126 unavoidably formed in the trench fill after removing pad oxide and nitride layers, noting a portion of gate electrode material 110 filling the divot. The layer of high-K dielectric material 105 extends proximate trench corners 107 resulting in Fermi-level pinning and degradation of mobility from the high-K/substrate interface. Consequently, any parasitic transistor formed at the trench corners exhibits a higher threshold voltage and reduced mobility.

Figure 2I:
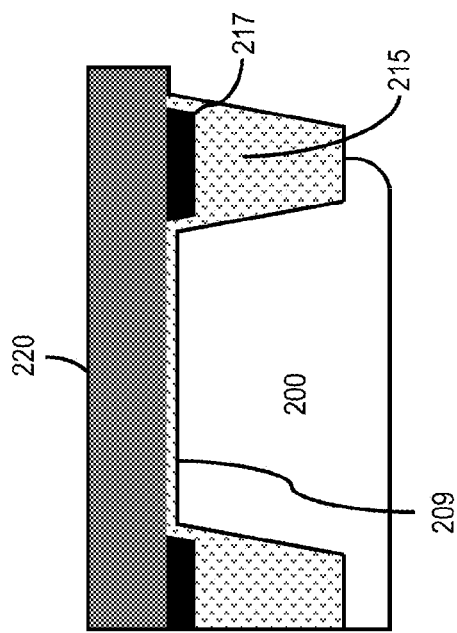

Another method in accordance with an embodiment of the present disclosure is schematically illustrated in FIGS. 2A through 2G. As in the previous embodiment, a trench 203, having side surfaces 213, bottom 223, as having a width of 500 Å to 1000 Å, e.g., 790 Å to 810 Å, and a depth of 1500 Å to 4000 Å, e.g., 2450 Å to 2550 Å, is formed in substrate 200 by initially forming a pad oxide layer 201 and a pad nitride layer 202 on substrate 200, followed by etching, as by RIE. A liner oxide 204 is then formed on side surfaces 213 and bottom surface 223 of trench 203, as shown in FIG. 2B. In accordance with this embodiment, insulating material 205 is then deposited in trench 203 forming an overburden on pad nitride layer 202, e.g., by a high aspect ratio process, as shown in FIG. 2C.

Subsequently, planarization is implemented, as by CMP, such that the upper surface of the insulating material filling the trench is substantially coplanar with the upper surface of pad nitride layer 202, as illustrated in FIG. 2D.

In accordance with an embodiment of the present disclosure, a portion of the insulating material filling trench 203 is removed to form a recess 206 extending below the upper surface of the substrate 200, as at a distance (X) of 20 Å to 80 Å, e.g., 48 Å to 52 Å, leaving remaining insulating material 215 in the trench, as illustrated in FIG. 2E. A layer of high-K dielectric material 207 is then deposited filling the trench extending above the recess and forming an overburden on the pad nitride layer 202, as illustrated in FIG. 2F. High-K dielectric material layer 207 may be deposited at a thickness of 50 Å to 200 Å, e.g., 95 Å to 105 Å.

Figure 2G:
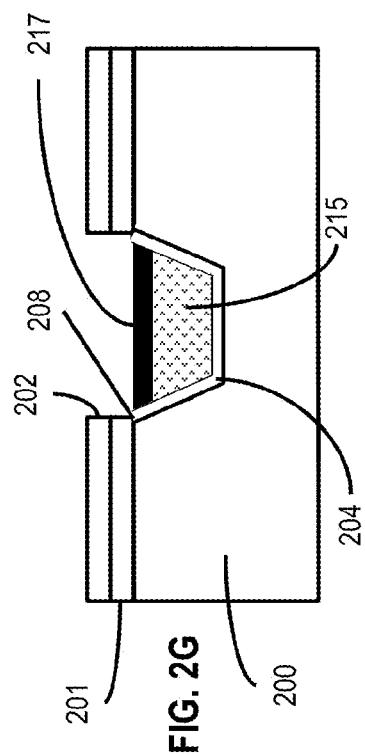

Subsequently, planarization, as by CMP, is implemented to remove the high-K dielectric material overburden from pad nitride layer 202, followed by etching, as with a wet etch (HF-based 40 deg-80 deg) or a plasma etching $Cl_2$/CO gas chemistry, to remove the portion of high-K dielectric material above the recess, such that the high-K dielectric material 217 filling the recess has an upper surface substantially coplanar with the upper surface of the substrate, as illustrated in FIG. 2G. In an alternative embodiment, a portion of liner oxide 204 above insulating material 215 is removed before depositing the layer of high-K dielectric material 207, resulting in direct contact between the high-K dielectric layer 217 and substrate 200 in the upper portion of the trench.

Figure 2H:
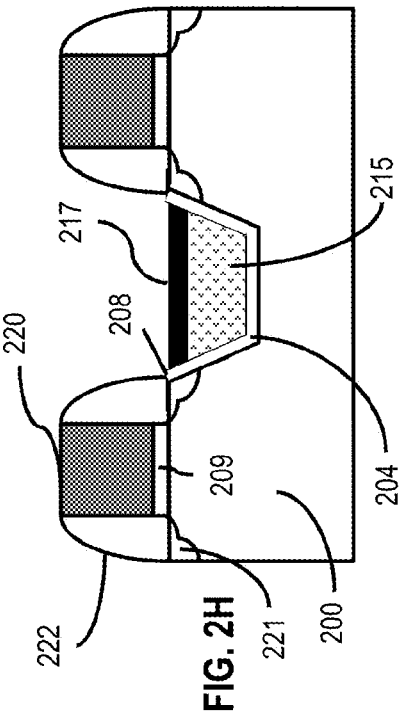

Subsequent processing comprises removing the pad oxide and nitride layers 201 and 202, respectively, and forming transistors spaced apart by the resulting STI. For example, each transistor may comprise a gate dielectric layer 209, gate electrode 220, source/drain regions 221, and sidewall spacers 222. The resulting structure in the channel length direction is illustrated in FIG. 2H, and in the channel width direction in FIG. 2I. Advantageously, the layer of high-K dielectric material 217 formed in the recess of the insulating material in the trench extends proximate trench corners 208, thereby effectively increasing the threshold voltage of and reducing mobility of a parasitic transistor which may be formed at the trench corners.

Another method in accordance with an embodiment of the present disclosure is schematically illustrated in FIGS. 3A through 3D. This embodiment is similar to the previous embodiment illustrated in FIGS. 2A through 2H up to the intermediate structure illustrated in FIG. 2F, which is substantially the same as the intermediate structure illustrated in FIG. 3A. In other words, processing in this embodiment up to the intermediate structure shown in FIG. 3A parallels the process flow of the previous embodiment illustrated in FIGS. 2A through 2F. After forming the intermediate structure shown in FIG. 3A, planarization, as by CMP, is implemented to remove portions of the high-K dielectric material layer 207 over the pad nitride layer 202, followed by an etch-back process, as with plasma etch (anisotropic etch) in Cl2/CO gas chemistry—to form high-K dielectric spacer 300 that extends proximate trench corners 208, as illustrated in FIG. 3B. Spacer 300 may have a height (Y) of 20 Å to 80 Å, e.g., 48 Å to 52 Å, and a width (Z) of 20 Å to 80 Å, e.g., 48 Å to 52 Å. This embodiment differs from the previous embodiment in that a high-K dielectric spacer 300 is formed in a recess proximate trench corners 208, instead of a high-K dielectric layer 217. Subsequently, additional insulating material, for example $SiO_2$, is deposited to fill the sub-recess 301 that was etched out when forming high-K dielectric spacer 300, resulting in the structure illustrated in FIG. 3C including insulating material 302 filling the trench. In an alternative embodiment, a portion of liner oxide 204 above insulating material 215 is removed before depositing the layer of high-K dielectric layer 207, resulting in direct contact between the high-K dielectric spacer 300 and substrate 200 in the upper portion of the trench.

Subsequent processing comprises removing pad nitride 202 and pad oxide 201 layers, and forming transistors on opposite sides of the STI. For example, each transistor may comprise a gate dielectric layer 209, gate electrode 220, source/drain regions 221, and sidewall spacers 222. The resulting structure in illustrated in the channel length direction in FIG. 3D and in the channel width direction in FIG. 3E, noting a portion of gate electrode material 230 filling a divot in the insulating trench fill. As in previous embodiments, high-K dielectric spacer 300 effectively increases the threshold voltage and reduces mobility of any parasitic transistor which may be formed at the trench corners.

The embodiments of the present disclosure achieve several technical effects, particularly in fabricating semiconductor devices with dimensions in the deep submicron range exhibiting reduced leakage, thereby enhancing process flow while increasing device performance, yield, and reliability. Embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a pad oxide layer on an upper surface of a substrate;
    forming a pad nitride layer on the pad oxide layer;
    forming a trench, having side surfaces and a bottom surface, in the substrate, through the pad oxide and pad nitride layers;
    forming an oxide liner on the side surfaces and bottom surface of the trench;
    forming a layer of high-K dielectric material on the oxide liner, on side surfaces of the pad oxide and pad nitride layers, and on an upper surface of the pad nitride layer;
    filling the trench with insulating material by a high aspect ratio process forming an overburden over the pad nitride layer subsequent to forming the layer of high-K dielectric material; and
    removing portions of the insulating material and high-K dielectric layer, the pad nitride layer, and the pad oxide layer by planarizing down to an upper surface of the pad nitride layer followed by etching,
    wherein after the etching, high-K dielectric spacers are formed only at upper corners of the trench.

2. The method according to claim 1, comprising:
    forming the oxide liner to a thickness of 10 Å to 40 Å; and
    forming the high-K dielectric spacers to a height and width of 20 Å to 80 Å.

3. The method according to claim 1, comprising forming the trench by reactive ion etching (RIE).

4. The method according to claim 1, further comprising forming transistors on the substrate separated by the filled trench.

5. A method comprising:
    forming a pad oxide layer on an upper surface of a substrate;
    forming a pad nitride layer on the pad oxide layer;
    forming a trench, having side surfaces and a bottom surface, in the substrate, through the pad oxide and pad nitride layers, by reactive ion etching (RIE);
    forming an oxide liner to a thickness of 10 Å to 40 Å on the side surfaces and bottom surface of the trench;
    forming a layer of high-K dielectric material layer on the oxide liner, on side surfaces of the pad oxide and pad nitride layers, and on an upper surface of the pad nitride layer;
    filling the trench with insulating material by a high aspect ratio process forming an overburden over the pad nitride layer subsequent to forming the layer of high-K dielectric material;
    planarizing down to an upper surface of the pad nitride layer; and
    etching portions of the insulating material and high-K dielectric layer above the upper surface of the substrate, the pad nitride layer, and the pad oxide layer,
    wherein after the etching, high-K dielectric spacers are formed only at upper corners of the trench to a height and width of 20 Å to 80 Å.

* * * * *